(12) United States Patent
Homer et al.

(10) Patent No.: US 7,756,226 B2
(45) Date of Patent: Jul. 13, 2010

(54) METHOD AND SYSTEM FOR CONVERTING LOGARITHMIC VALUES INTO LINEAR VALUES IN DIGITAL LOGIC

(75) Inventors: Johnny T. Homer, Plano, TX (US); William M. Hurley, Murphy, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 964 days.

(21) Appl. No.: 11/487,822

(22) Filed: Jul. 17, 2006

(65) Prior Publication Data

US 2008/0013652 A1    Jan. 17, 2008

(51) Int. Cl.
*H04L 27/08* (2006.01)
(52) U.S. Cl. .................................. 375/345; 375/316

(58) Field of Classification Search ................. 375/345, 375/316; 364/722, 748, 857
See application file for complete search history.

(56) References Cited

U.S. PATENT DOCUMENTS 5,726,924 A * 3/1998 Buss et al. ................. 708/277
2008/0013652 A1 * 1/2008 Homer et al. ............... 375/345

* cited by examiner

*Primary Examiner*—David C Payne
*Assistant Examiner*—Zewdu Kassa (57) ABSTRACT

A method for converting logarithmic values into linear values in digital logic is provided. The method includes receiving a logarithmic gain signal. A shift signal is generated based on the logarithmic gain signal. A remainder signal is generated based on the logarithmic gain signal. A linear gain is applied to a digital input signal based on the shift signal and the remainder signal to generate a digital output signal.

14 Claims, 5 Drawing Sheets

METHOD AND SYSTEM FOR CONVERTING LOGARITHMIC VALUES INTO LINEAR VALUES IN DIGITAL LOGIC

CROSS-REFERENCE TO RELATED APPLICATION(S)

The present application is related to U.S. patent application Ser. No. 11/487,831, titled "Method and System for Partitioning Gain for Wireless Radio Frequency Integrated Circuits," filed concurrently herewith. patent application Ser. No. 11/487,831 is assigned to the assignee of the present application. The subject matter disclosed in patent application Ser. No. 11/487,831 is hereby incorporated by reference into the present disclosure as if fully set forth herein.

TECHNICAL FIELD OF THE INVENTION

The present application relates generally to integrated circuits and, more specifically, to a method and system for converting logarithmic values into linear values in digital logic.

BACKGROUND OF THE INVENTION

The communication channel between a digital baseband controller and a radio frequency integrated circuit (RFIC) in a wireless communication device, such as a base station or wireless station, is typically low bandwidth. In conventional devices, the digital baseband controller determines a logarithmic gain for the RFIC to apply to digital signals. However, the RFIC is generally unable to convert a logarithmic gain into a linear gain because the inverse-log function involves a complicated computation. Because of this, some implementations of digital baseband controllers provide for the digital baseband controller to convert the logarithmic gain into a linear gain and then to send the linear gain to the RFIC. However, because of the low bandwidth communication channel and the large number of bits needed to communicate typical linear gain values (e.g., values with a range of approximately 100 dB), many transactions are needed to complete the transfer of the linear gain.

An additional failing of communicating a large number of bits over many transactions is that the gain change from the initial value to the final value occurs over a greater period of time. Therefore, the gain may go through one or more intermediate states while the final "bits" are transferred. During the transition time, the receive signal fidelity could be significantly degraded, resulting in higher error rates, and lower performance. Therefore, there is a need in the art for an improved method of providing the logarithmic gain determined by the digital baseband controller as a linear gain to the RFIC.

SUMMARY OF THE INVENTION

A method for converting logarithmic values into linear values in digital logic is provided. According to an advantageous embodiment of the present disclosure, the method includes receiving a logarithmic gain signal. A shift signal is generated based on the logarithmic gain signal. A remainder signal is generated based on the logarithmic gain signal. A linear gain is applied to a digital input signal based on the shift signal and the remainder signal to generate a digital output signal.

According to another embodiment of the present disclosure, a system for converting logarithmic values into linear values in digital logic is provided that includes a coarse gain block and a fine gain block. The coarse gain block is operable to receive a digital input signal and to shift the digital input signal based on a logarithmic gain signal to generate an intermediate signal. The fine gain block is coupled to the coarse gain block and is operable to multiply the intermediate signal by a multiplier to generate a digital output signal.

According to another embodiment of the present disclosure, a wireless communication device is provided that includes a digital baseband controller and a radio frequency integrated circuit (RFIC). The digital baseband controller is operable to generate a logarithmic gain signal. The RFIC is coupled to the digital baseband controller. The RFIC is operable to receive the logarithmic gain signal, to generate a linear gain based on the logarithmic gain signal, and to apply the linear gain to a digital input signal in order to generate a digital output signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or" is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged digital circuit.

Figure 1:
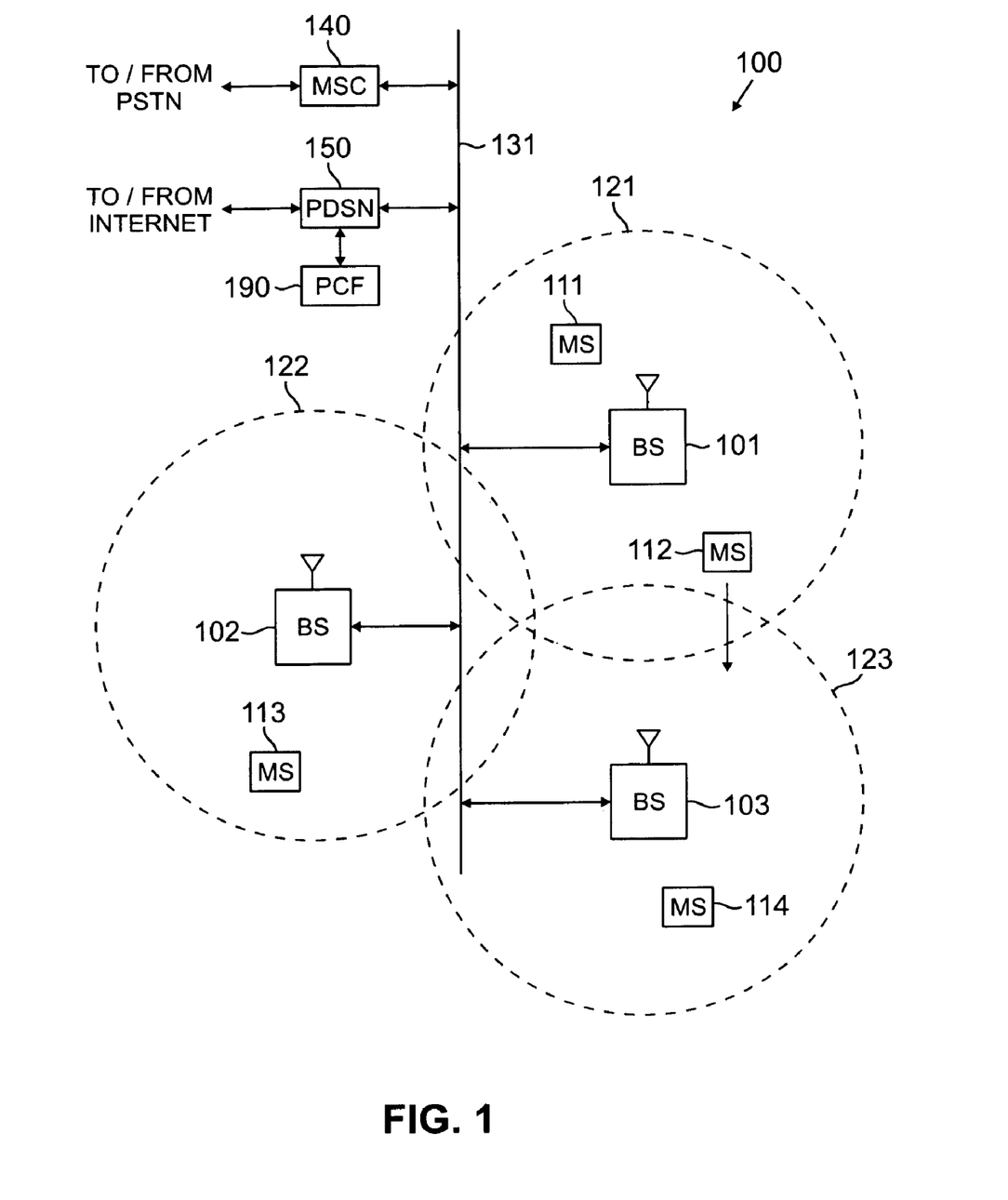
FIG. 1 illustrates a wireless network including components operable to convert logarithmic values into linear values in digital logic according to one embodiment of the disclosure.

FIG. 1 illustrates a wireless network 100 including components operable to convert logarithmic values into linear values in digital logic according to one embodiment of the disclosure. Wireless network 100 comprises a plurality of cells (or cell sites) 121-123, each containing one of the base stations, BS 101, BS 102, or BS 103. Base stations 101-103 communicate with a plurality of mobile stations (MS) 111-114 over code division multiple access (CDMA) channels according to, for example, the IS-2000 standard (i.e., CDMA2000). In an advantageous embodiment of the present disclosure, mobile stations 111-114 are capable of receiving data traffic and/or voice traffic on two or more CDMA channels simultaneously. Mobile stations 111-114 may be any suitable wireless devices (e.g., conventional cell phones, PCS handsets, personal digital assistant (PDA) handsets, portable computers, telemetry devices) that are capable of communicating with base stations 101-103 via wireless links.

The present disclosure is not limited to mobile devices. The present disclosure also encompasses other types of wireless access terminals, including fixed wireless terminals. For the sake of simplicity, only mobile stations are shown and discussed hereafter. However, it should be understood that the use of the term "mobile station" in the claims and in the description below is intended to encompass both truly mobile devices (e.g., cell phones, wireless laptops) and stationary wireless terminals (e.g., a machine monitor with wireless capability).

Dotted lines show the approximate boundaries of cells (or cell sites) 121-123 in which base stations 101-103 are located. It is noted that the terms "cells" and "cell sites" may be used interchangeably in common practice. For simplicity, the term "cell" will be used hereafter. The cells are shown approximately circular for the purposes of illustration and explanation only. It should be clearly understood that the cells may have other irregular shapes, depending on the cell configuration selected and variations in the radio environment associated with natural and man-made obstructions.

As is well known in the art, each of cells 121-123 is comprised of a plurality of sectors, where a directional antenna coupled to the base station illuminates each sector. The embodiment of FIG. 1 illustrates the base station in the center of the cell. Alternate embodiments may position the directional antennas in corners of the sectors. The system of the present disclosure is not limited to any particular cell configuration.

In one embodiment of the present disclosure, each of BS 101, BS 102 and BS 103 comprises a base station controller (BSC) and one or more base transceiver subsystem(s) (BTS). Base station controllers and base transceiver subsystems are well known to those skilled in the art. A base station controller is a device that manages wireless communications resources, including the base transceiver subsystems, for specified cells within a wireless communications network. A base transceiver subsystem comprises the radio frequency (RF) transceivers, antennas, and other electrical equipment located in each cell. This equipment may include air conditioning units, heating units, electrical supplies, telephone line interfaces and RF transmitters and RF receivers. For the purpose of simplicity and clarity in explaining the operation of the present disclosure, the base transceiver subsystems in each of cells 121, 122 and 123 and the base station controller associated with each base transceiver subsystem are collectively represented by BS 101, BS 102 and BS 103, respectively.

BS 101, BS 102 and BS 103 transfer voice and data signals between each other and the public switched telephone network (PSTN) (not shown) via communication line 131 and mobile switching center (MSC) 140. BS 101, BS 102 and BS 103 also transfer data signals, such as packet data, with the Internet (not shown) via communication line 131 and packet data server node (PDSN) 150. Packet control function (PCF) unit 190 controls the flow of data packets between base stations 101-103 and PDSN 150. PCF unit 190 may be implemented as part of PDSN 150, as part of MSC 140, or as a stand-alone device that communicates with PDSN 150, as shown in FIG. 1. Line 131 also provides the connection path for control signals transmitted between MSC 140 and BS 101, BS 102 and BS 103 that establish connections for voice and data circuits between MSC 140 and BS 101, BS 102 and BS 103.

Because of the continuing advancement of mixed-signal ASIC design and encroachment of digital processing into wireless RF integrated circuit (RFIC) spaces, digital logic may be implemented in an RFIC in any one or more of BS 101-103 and/or MS 111-114. In order to provide a silicon-efficient design for the replacement of typically analog components by digital processing, digital overhead associated with the migration to digital processing should be minimal. Such is the case for controlling gain in digital regions of wireless RFICs.

Digital gain is an inherently linear operation. For example, to achieve a doubling of signal level, a multiplier of two may be applied during signal processing. However, the gain for an analog RFIC is usually referenced in terms of decibels (dB). In terms of communication over the low-bandwidth channel from the digital baseband controller to the RFIC, transferring a logarithmic gain in the typical range of 100 dB is easily handled with one byte of information. However, transferring the same range of gain information in linear values would require on the order of 17 bits, doubling the bandwidth requirements of the channel and extending the time required for the gain change, which degrades signal quality. Thus, in order to allow the digital baseband controller processing and software used for RFIC gain control to remain unaltered, a mixed-signal RFIC is provided that is operable to convert a logarithmic-based gain command into a more digital-friendly linear multiplication process using a silicon-efficient method.

Because the inverse-logarithmic function is a transcendental function and thus is not easily implemented in an efficient manner with standard digital design tools, available techniques would involve look-up tables having pre-computed results over the possible range of inputs or iterative techniques. The former uses significant Read-Only-Memory (ROM) or Random-Access-Memory (RAM), and hence silicon area, to hold the pre-computed results. The latter uses significant area or high clock rates, both of which are detrimental to low cost, low power wireless design.

Therefore, as described in more detail below in connection with FIGS. 2-5, each of the base stations 101-103 and/or each of the mobile stations 111-114 may be operable to convert logarithmic values into linear values in digital logic in a silicon-efficient manner. For example, the base stations 101-103 and/or the mobile stations 111-114 may comprise RFICs that are each operable to receive a logarithmic value corresponding to a gain to be applied to a digital signal in the integrated circuit. The integrated circuit may then be operable to use shifting and a multiplier block with a small number of possible multipliers to apply that logarithmic gain based on its corresponding linear value in a digital region of the integrated circuit.

Communication line 131 may be any suitable connection means, including a T1 line, a T3 line, a fiber optic link, a network packet data backbone connection, or any other type of data connection. Alternatively, communication line 131 may be replaced by a wireless backhaul system, such as microwave transceivers. Communication line 131 links each vocoder in the BSC with switch elements in MSC 140. The connections on communication line 131 may transmit analog voice signals or digital voice signals in pulse code modulated (PCM) format, Internet Protocol (IP) format, asynchronous transfer mode (ATM) format, or the like.

MSC 140 is a switching device that provides services and coordination between the mobile stations in a wireless network and external networks, such as the PSTN or Internet. MSC 140 is well known to those skilled in the art. In some embodiments, communication line 131 may be several different data links where each data link couples one of BS 101, BS 102, or BS 103 to MSC 140.

In exemplary wireless network 100, MS 111 is located in cell 121 and is in communication with BS 101. MS 112 is also located in cell 121 and is in communication with BS 101. MS 113 is located in cell 122 and is in communication with BS 102. MS 114 is located in cell 123 and is in communication with BS 103. MS 112 is also located close to the edge of cell 123 and is moving in the direction of cell site 123, as indicated by the direction arrow proximate MS 112. At some point, as MS 112 moves into cell site 123 and out of cell site 121, a hand-off will occur.

Figure 2:
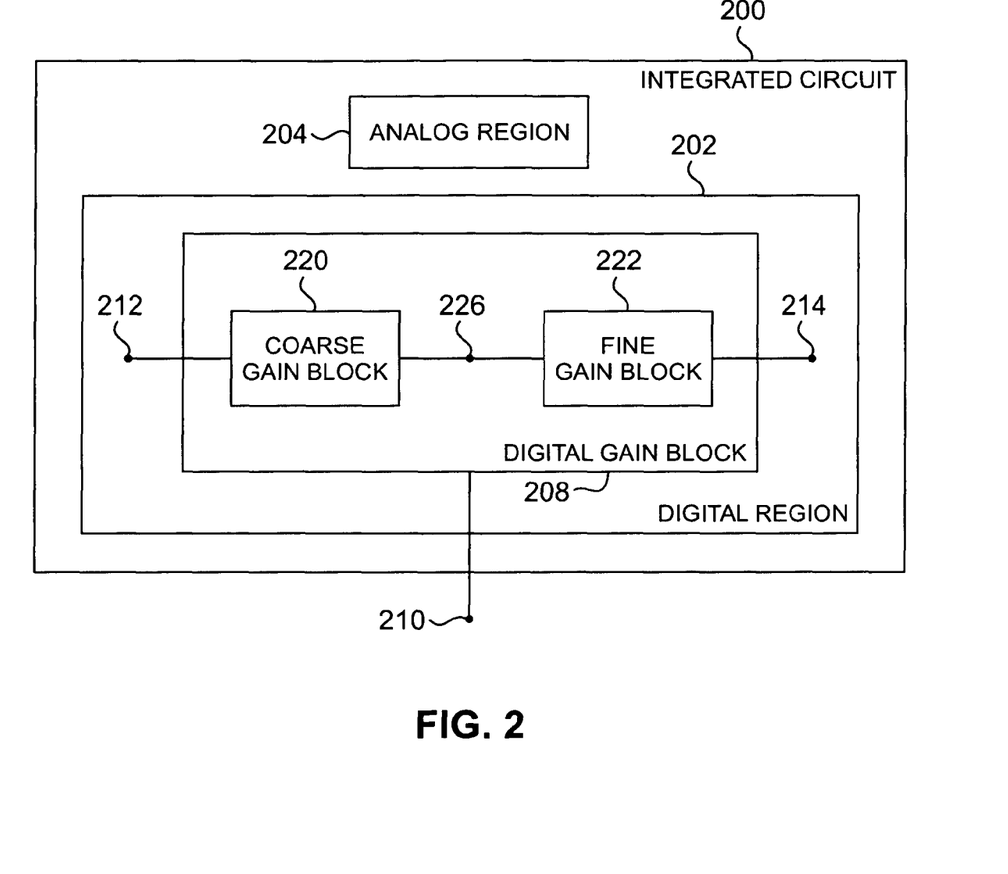
FIG. 2 illustrates an integrated circuit that may be used in one of the mobile stations or base stations of FIG. 1 and that is operable to convert logarithmic values into linear values according to one embodiment of the disclosure.

FIG. 2 illustrates an integrated circuit (IC) 200 that comprises a digital region 202 operable to provide digital processing and to convert logarithmic values into linear values according to one embodiment of the disclosure. In addition to the digital region 202, the IC 200 may comprise an analog region 204 operable to provide analog processing and/or any other suitable components. The IC 200 may comprise a radio frequency IC implemented in a mobile station 111-114 or base station 101-103; however, it will be understood that the IC 200 may be implemented in any other suitable system without departing from the scope of the present disclosure.

The digital region 202 comprises a digital gain block 208 that is operable to receive a logarithmic gain signal 210 and to apply a linear gain based on that signal 210 to a digital input signal 212 in order to generate a digital output signal 214. For the embodiment in which the IC 200 comprises an RFIC in a wireless communication device such as a mobile station 111-114, the logarithmic gain signal 210 may be received from a digital baseband controller, or modem, that is coupled to the IC 200.

The digital gain block 208 comprises a coarse gain block 220 and a fine gain block 222. The coarse gain block 220 is operable to receive the input signal 212 and to apply a coarse gain to that signal 212 in order to generate an intermediate signal 226. As described in more detail below in connection with FIGS. 3-5, the coarse gain block 220 is operable to apply the coarse gain by dividing the logarithmic gain signal 210 by a specified number and shifting the input signal 212 based on a quotient resulting from that division. For one embodiment, the specified number is approximately six because 6 dB of voltage gain corresponds to a linear gain of approximately two. Thus, the division in this embodiment provides the number of shifts to be used in applying the coarse gain.

The fine gain block 222 is coupled to the coarse gain block 220 and is operable to receive the intermediate signal 226 from the coarse gain block 220 and to apply a fine gain to that signal 226 in order to generate the output signal 214. As described in more detail below in connection with FIGS. 3-5, the fine gain block 222 is operable to apply the fine gain by multiplying the intermediate signal 226 by a multiplier selected based on a remainder resulting from the division of the logarithmic gain signal by the specified number.

Figure 3:
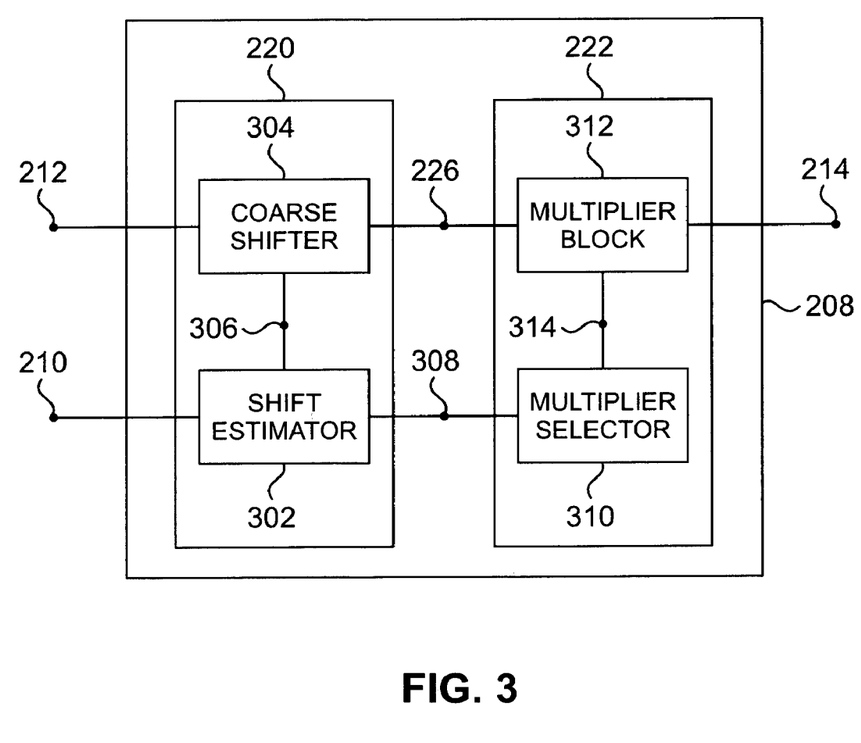
FIG. 3 illustrates details of the digital gain block of FIG. 2 according to one embodiment of the disclosure.

FIG. 3 illustrates details of the digital gain block 208 according to one embodiment of the disclosure. For this embodiment, the coarse gain block 220 comprises a shift estimator 302 and a coarse shifter 304. The shift estimator 302 is coupled to the coarse shifter 304.

The shift estimator 302 is operable to receive the logarithmic gain signal 210 and to divide that signal 210 by a specified number in order to estimate a linear gain value corresponding to the logarithmic gain signal 210. For one embodiment, the specified number may be approximately six. The shift estimator 302 is also operable to generate a shift signal 306 based on the quotient resulting from that division and to generate a remainder signal 308 based on the remainder resulting from that division.

The coarse shifter 304 is operable to receive the input signal 212 and the shift signal 306 and to shift the input signal 212 based on the shift signal 306 to generate the intermediate signal 226. For example, if the shift signal 306 comprises a value of five, the coarse shifter 304 shifts the input signal 212 by five in order to apply a coarse gain to the input signal 212 and generate the intermediate signal 226. Thus, the shift signal 306 comprises a number that corresponds to the number of shifts to be applied to the input signal 212.

The fine gain block 222 comprises a multiplier selector 310 and a multiplier block 312. The multiplier selector 310 is coupled to the multiplier block 312. The multiplier selector 310 is operable to receive the remainder signal 308 and to select a multiplier from a plurality of possible multipliers based on the remainder signal 308. Thus, the remainder signal 308 is operable to identify one of the multipliers for the multiplier selector 310.

For a particular embodiment, the possible multipliers comprise values between one and two (including one). In addition, for one embodiment, the multiplier selector 310 is operable to store the plurality of possible multipliers (e.g., in a look-up table or other suitable data store). For another embodiment, the multiplier selector 310 may be operable to provide the multiplier using direct logic. The multiplier selector 310 is also operable to generate a multiplier signal 314 comprising the selected multiplier.

The number of possible multipliers may be based on a desired resolution for the digital gain block 208. For example, for the specified number of approximately six, a logarithmic gain range of 100 dB (such as −20 to 80 dB, 0 to 100 dB, or other 100 dB range) and a resolution of 1.5 dB, the multiplier selector 310 may be operable to select a multiplier from four possible multipliers. For the specified number of approximately six, a gain range of 100 dB and a resolution of 1 dB, the multiplier selector 310 may be operable to select a multiplier from six possible multipliers. For the specified number of approximately six, a gain range of 100 dB and a resolution of 0.5 dB, the multiplier selector 310 may be operable to select a multiplier from twelve possible multipliers. It will be understood that other suitable specified numbers, gain ranges and/or resolutions may be used and result in different numbers of possible multipliers.

For a particular embodiment, the multiplier selector 310 is operable to select from a plurality of possible static multipliers. For this embodiment, the static multipliers are predetermined and may be stored in the multiplier selector 310 as previously described. For an alternative embodiment, the multiplier selector 310 may be configurable with variable multipliers. For example, the number of possible multipliers and/or the values of the possible multipliers may be variable based on input provided by a component in the integrated circuit 200 or coupled to the integrated circuit 200, by a user, or through any other suitable means. As another alternative, the multiplier selector 310 may be operable to derive the multipliers with every conversion of logarithmic gain to linear gain. However, both of these alternatives would consume additional silicon area and, thus, be less silicon-efficient.

The multiplier block 312 is operable to receive the intermediate signal 226 and the multiplier signal 314 and to multiply the intermediate signal 226 by the selected multiplier to generate the output signal 214. Thus, the coarse shifter 304 is operable to apply a coarse gain to the input signal 212 to generate the intermediate signal 226 based on the shift signal 306 from the shift estimator 302, and the multiplier block 312 is operable to apply a fine gain to the intermediate signal 226 to generate the output signal 214 based on the multiplier signal 314 from the multiplier selector 310.

Figure 4:
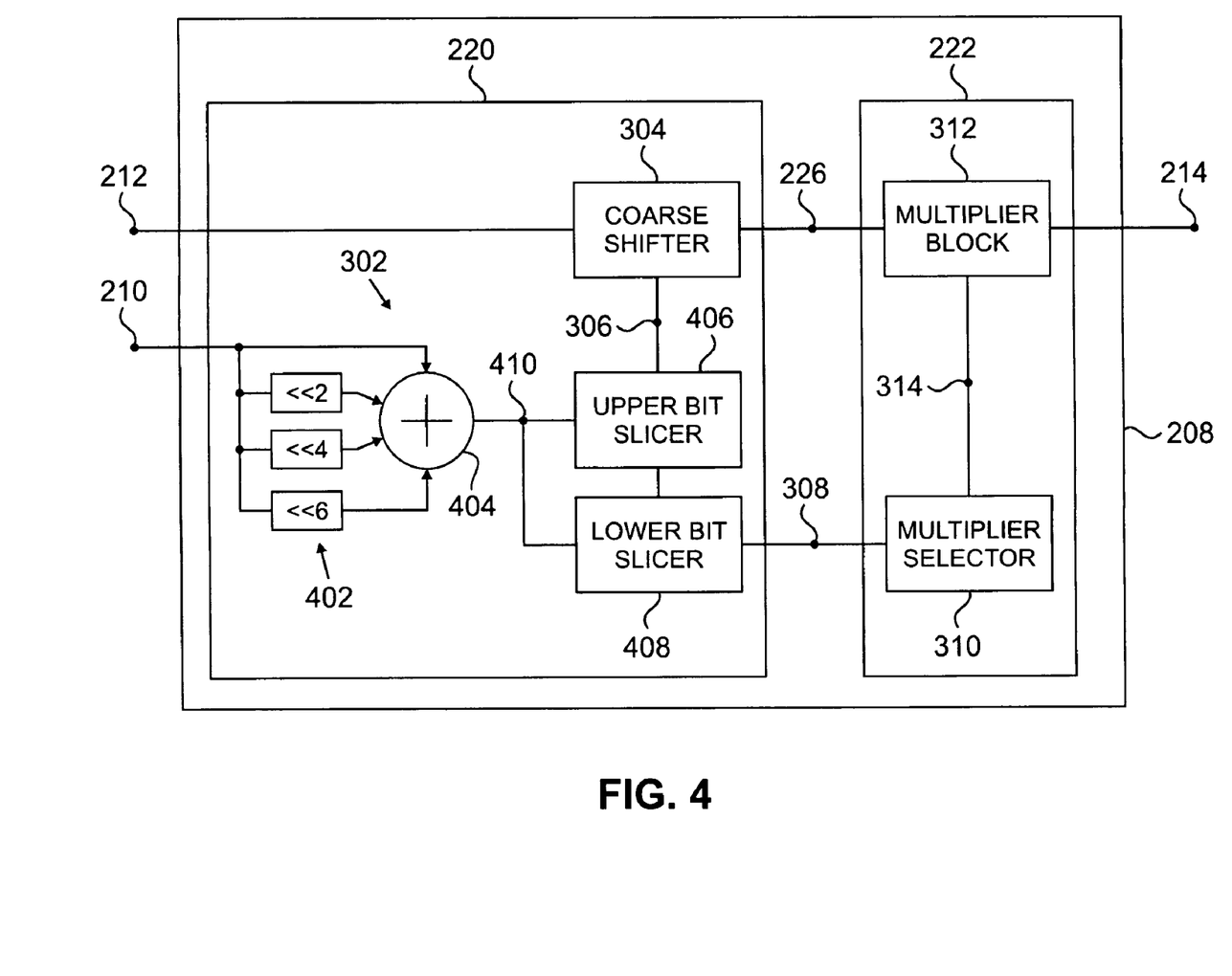
FIG. 4 illustrates details of the shift estimator of FIG. 3 according to one embodiment of the disclosure.

FIG. 4 illustrates details of the shift estimator 302 in the digital gain block 208 of FIG. 3 according to one embodiment of the disclosure. For this embodiment, the shift estimator 302 is operable to implement an approximation of a division by six for generating the shift signal 306 based on the logarithmic gain signal 210.

The shift estimator 302 in this embodiment comprises three left-shifters 402, a summation block 404, an upper bit slicer 406 and a lower bit slicer 408. The left-shifters 402 are operable to left-shift the logarithmic gain signal 210. The summation block 404 is operable to sum its inputs to generate a sum signal 410. The upper bit slicer 406 is operable to bit slice the most significant bits of the sum signal 410 to generate the shift signal 306. The lower bit slicer 408 is operable to bit slice the least significant bits of the sum signal 410 to generate the remainder signal 308.

In operation, for one embodiment, the shift estimator 302 receives the logarithmic gain signal 210 and provides the signal 210 to each of the left-shifters 402 and the summation block 404. The three left-shifters 402 left-shift the logarithmic gain signal 210 by two, four and six, respectively, and provide the shifted results to the summation block 404. Thus, the summation block 404 sums the logarithmic gain signal 210 with the three left-shifted signals from the left-shifters 402. This results in the summation block 404 generating a sum signal 410 that is equivalent to the logarithmic gain signal 210 multiplied by 85.

For one embodiment, the upper bit slicer 406 bit slices the most significant bits of the sum signal 410 down to the last nine bits. Thus, all bits of the sum signal 410 except the nine least significant bits remain as the shift signal 306. For this embodiment, the shift signal 306 is equivalent to the quotient of the sum signal 410 divided by 512, or the quotient of the logarithmic gain signal 210 divided by approximately 6.0235.

The lower bit slicer 408 bit slices the nine least significant bits of the sum signal 410. Thus, the remainder signal 308 comprises the nine least significant bits of the sum signal 410, which is equivalent to the remainder of the sum signal 410 divided by 512, or the remainder of the logarithmic gain signal 210 divided by approximately 6.0235.

Using this embodiment, therefore, the coarse gain block 220 is operable to apply a coarse gain by shifting the input signal 212 by a number of shifts specified in the shift signal 306. The fine gain block 222 is then operable to apply a fine gain by multiplying the intermediate signal 226 by a multiplier with a value between one and two (including one).

For a particular embodiment, using a logarithmic gain range of 100 dB and a resolution of 1.5 dB, the multiplier selector 310 may be operable to select from one of four multipliers as follows:

| Remainder | Multiplier |
|---|---|
| 0-127 | 1 |
| 128-255 | 1.18 |
| 256-383 | 1.41 |
| 384-512 | 1.67 |

However, it will be understood that other suitable remainder ranges and/or other suitable multipliers may be used without departing from the scope of this disclosure.

Figure 5:
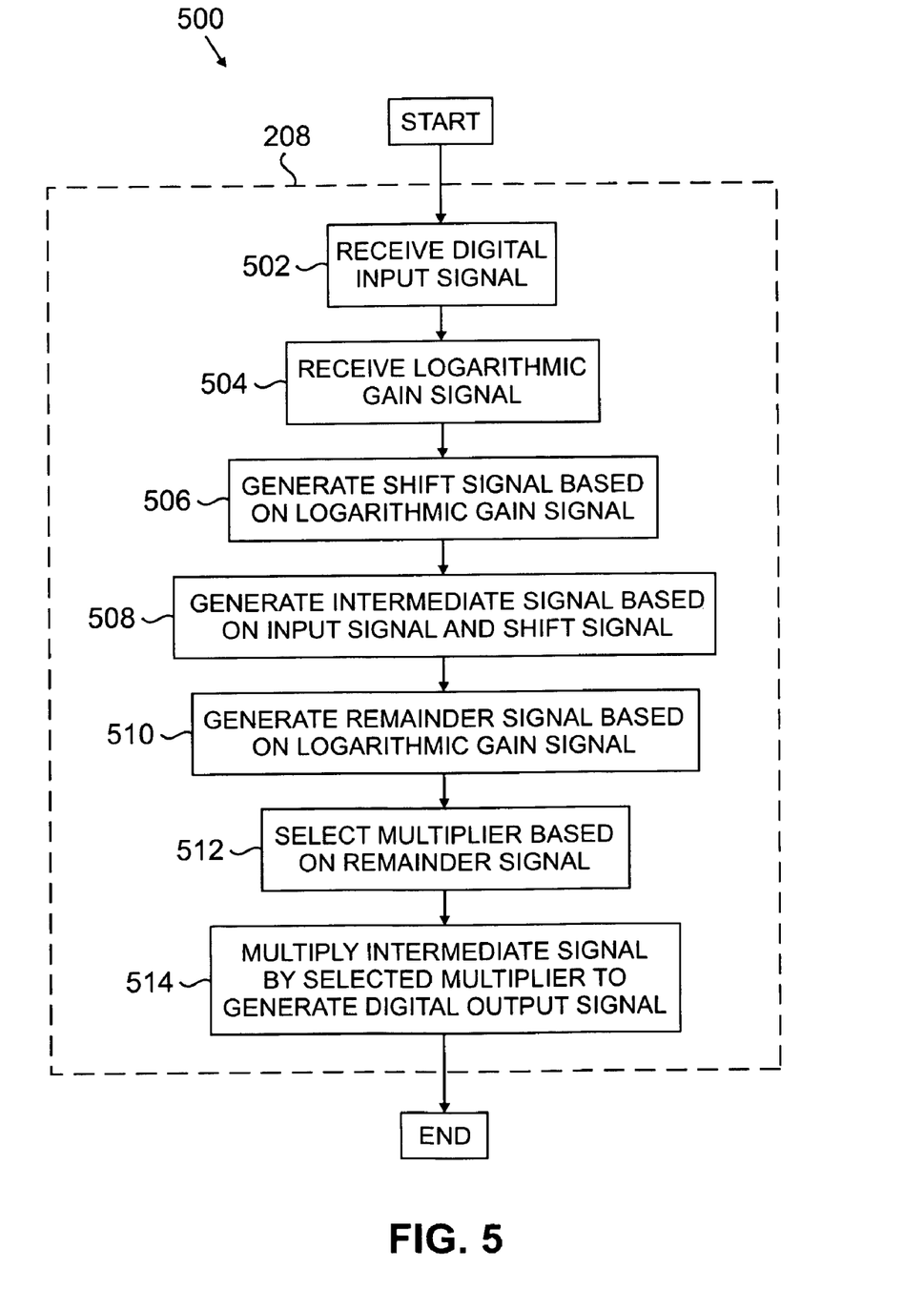
FIG. 5 is a flow diagram illustrating a method for converting logarithmic values into linear values using the digital gain block of FIG. 2, 3 or 4 according to one embodiment of the disclosure.

FIG. 5 is a flow diagram illustrating a method 500 for converting logarithmic values into linear values using the digital gain block 208 according to one embodiment of the disclosure. Although described as discrete steps in a particular order, it will be understood that the steps of this method may be performed by the various components of the digital gain block 208 based on signals received at each of the components when those signals are received.

Initially, the coarse shifter 304 receives a digital input signal 212 (process step 502). The shift estimator 302 receives a logarithmic gain signal 210 (process step 504). For one embodiment, the shift estimator 302 receives the logarithmic gain signal 210 from a digital baseband controller, or modem.

The shift estimator 302 generates a shift signal 306 based on the logarithmic gain signal 210 (process step 506). For one embodiment, the shift estimator 302 generates the shift signal 306 based on the logarithmic gain signal 210 by dividing the logarithmic gain signal 210 by a specified number (approximately six for one embodiment) and bit slicing the most significant bits of the result (down to the last nine bits for one embodiment).

The coarse shifter 304 generates the intermediate signal 226 based on the input signal 212 and the shift signal 306 (process step 508). For one embodiment, the coarse shifter 304 generates the intermediate signal 226 by shifting the input signal 212 by a number of shifts provided in the shift signal 306.

The shift estimator 302 generates a remainder signal 308 based on the logarithmic gain signal 210 (process step 510). For one embodiment, the shift estimator 302 generates the remainder signal 308 based on the logarithmic gain signal 210 by bit slicing the least significant bits of the result of the division of the logarithmic gain signal 210 by the specified number (the nine least significant bits for one embodiment).

The multiplier selector 310 selects a multiplier from a plurality of possible multipliers based on the remainder signal 308 to generate a multiplier signal 314 (process step 512). For one embodiment, the multiplier selector 310 selects the multiplier from a look-up table. The multiplier block 312 multiplies the intermediate signal 226 by the selected multiplier as provided in the multiplier signal 314 to generate a digital output signal 214 (process step 514).

In this way, the digital region 202 of the IC 200 may continue to evolve without placing an undue burden on wireless platform development. Furthermore, communication between a digital baseband controller and the IC 200 may be performed using logarithmic gain values instead of linear gain values, minimizing bandwidth requirements for gain changes. In addition, the digital gain block 208 is capable of estimating and applying a linear gain based on a logarithmic gain value with a combination of bit-slicing, addition and shifting, along with an extremely small look-up table, instead of with an extensive look-up table.

Therefore, implementation of this digital gain block 208 allows for continued use of the paradigm in which wireless RFIC gains are controlled in terms of logarithmic values. As a result, barriers to market penetration in which software and system changes are costly are eliminated. Furthermore, the digital gain block 208 consumes a minimal amount of silicon area and operates at a minimal clock rate, thus allowing for usage in the targeted low-cost, low-power wireless RFIC market.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for converting logarithmic values into linear values in digital logic in an integrated circuit, comprising:
   receiving a logarithmic gain signal;
   dividing the logarithmic gain signal by a specified number to generate a shift signal and a remainder signal, wherein a shift estimator is configured to to divide the logarithmic gain signal by a specified number to generate a shift signal and a remainder signal, wherein a coarse shifter is coupled to the shift estimator and configured to shift the digital input signal based on the shift signal, wherein the shift estimator comprises a plurality of shifters, a summation block is coupled to the shifters, an upper bit slicer is coupled to the summation block and a lower bit slicer coupled to the summation block, wherein the plurality of shifters left-shift the logarithimic gain signal, and wherein the summation block is configured to add the logarithmic gain signal to an output of each of the shifters to generate a sum signal;
   generating the shift signal by bit slicing a first specified number of most significant bits of the sum signal; and
   applying a linear gain to a digital input signal based on the shift signal and the remainder signal to generate a digital output signal.

2. The method as set forth in claim 1, applying the linear gain comprising shifting the digital input signal based on the shift signal to generate an intermediate signal.

3. The method as set forth in claim 2, further comprising selecting a multiplier based on the remainder signal, applying the linear gain further comprising multiplying the intermediate signal by the selected multiplier to generate the digital output signal.

4. The method as set forth in claim 1, further comprising dividing the logarithmic gain signal by a specified number.

5. The method as set forth in claim 4, generating the shift signal comprising generating the shift signal based on a quotient resulting from the division, and generating the remainder signal comprising generating the remainder signal based on a remainder resulting from the division.

6. The method as set forth in claim 4, the specified number comprising approximately six.

7. The method as set forth in claim 1, receiving the logarithmic gain signal comprising receiving the logarithmic gain signal from a digital baseband controller.

8. A system for converting logarithmic values into linear values in digital logic, comprising:
   a coarse gain block operable to receive a digital input signal and to shift the digital input signal based on a logarithmic gain signal to generate an intermediate signal; and
   a fine gain block coupled to the coarse gain block, the fine gain block operable to multiply the intermediate signal by a multiplier to generate a digital output signal, the coarse gain block comprising: a shift estimator operable to divide the logarithmic gain signal by a specified number to generate a shift signal and a remainder signal, and a coarse shifter coupled to the shift estimator, the coarse shifter operable to shift the digital input signal based on the shift signal; the shift estimator comprising a plurality of shifters, a summation block coupled to the shifters, an upper bit slicer coupled to the summation block and a lower bit slicer coupled to the summation block, the plurality of shifters comprising a first shifter operable to left-shift the logarithmic gain signal by two, a second shifter operable to left-shift the logarithmic gain signal by four and a third shifter operable to left-shift the logarithmic gain signal by six, the summation block operable to add the logarithmic gain signal to an output of each of the shifters to generate a sum signal, and the upper bit slicer operable to generate the shift signal by bit slicing a first specified number of most significant bits of the sum signal.

9. The system as set forth in claim 8, the fine gain block comprising:
   a multiplier selector operable to select the multiplier based on the remainder signal, and
   a multiplier block coupled to the multiplier selector, the multiplier block operable to multiply the intermediate signal by the selected multiplier.

10. The system as set forth in claim 8, the specified number comprising approximately six.

11. The system as set forth in claim 8, the lower bit slicer operable to generate the remainder signal by bit slicing a second specified number of least significant bits of the sum signal.

12. A wireless communication device, comprising:
   a digital baseband controller operable to generate a logarithmic gain signal; and
   a radio frequency integrated circuit (RFIC) coupled to the digital baseband controller, the RFIC operable to receive the logarithmic gain signal, to generate a linear gain based on the logarithmic gain signal, and to apply the linear gain to a digital input signal in order to generate a digital output signal, the RFIC comprising an analog region and a digital region, the digital region comprising a digital gain block, the digital gain block comprising: a coarse gain block operable to shift the digital input signal based on the logarithmic gain signal to generate an intermediate signal; and a fine gain block coupled to the coarse gain block, the fine gain block operable to multiply the intermediate signal by a multiplier to generate the digital output signal, the coarse gain block comprising: a shift estimator operable to divide the logarithmic gain signal by a specified number to generate a shift signal and a remainder signal, and a coarse shifter coupled to the shift estimator, the coarse shifter operable to shift the digital input signal based on the shift signal, the shift estimator comprising a plurality of shifters, a summation block coupled to the shifters, an upper bit slicer coupled to the summation block and a lower bit slicer coupled to the summation block, the plurality of shifters comprising a first shifter operable to left-shift the logarithmic gain signal by two, a second shifter operable to left-shift the logarithmic gain signal by four and a third shifter operable to left-shift the logarithmic gain signal by six, the summation block operable to add the logarithmic gain signal to an output of each of the shifters to generate a sum signal, the upper bit slicer operable to generate the shift signal by bit slicing a first specified number of most significant bits of the sum signal, and the lower bit slicer operable to generate the remainder signal by bit slicing a second specified number of least significant bits of the sum signal.

13. The device as set forth in claim 12, the fine gain block comprising:
   a multiplier selector operable to select the multiplier based on the remainder signal, and
   a multiplier block coupled to the multiplier selector, the multiplier block operable to multiply the intermediate signal by the selected multiplier.

14. The device as set forth in claim 12, the specified number comprising approximately six.

\* \* \* \* \*

UNITED STATES PATENT AND TRADEMARK OFFICE
CERTIFICATE OF CORRECTION

| | | |
|---|---|---|
| PATENT NO. | : 7,756,226 B2 | |
| APPLICATION NO. | : 11/487822 | |
| DATED | : July 13, 2010 | |
| INVENTOR(S) | : Johnny T. Homer et al. | |

It is certified that error appears in the above-identified patent and that said Letters Patent is hereby corrected as shown below:

Column 9, claim 1, line 44, delete "logarithimic" and replace with --logarithmic--.

Signed and Sealed this
Seventeenth Day of May, 2011

David J. Kappos
*Director of the United States Patent and Trademark Office*